United States Patent
Kastner et al.

(10) Patent No.: US 6,896,938 B2
(45) Date of Patent: May 24, 2005

(54) METALLIZED FILM, METHOD FOR THE PRODUCTION THEREOF, AND USE THEREOF

(75) Inventors: Friedrich Kastner, Grieskirchen (AT); Martin Bergsmann, Leonding (AT); Johann Hillburger, Pirk (DE); Ronald Einsiedler, Baumgartenberg (AT); Roland Treutlein, Pirk (DE)

(73) Assignee: Hueck Folien Gesellschaft m.b.H., Baumgartenberg (AT)

( * ) Notice: Subject to any disclaimer, the term of this patent is extended or adjusted under 35 U.S.C. 154(b) by 0 days.

(21) Appl. No.: 10/407,000

(22) Filed: Apr. 3, 2003

(65) Prior Publication Data

US 2003/0175545 A1 Sep. 18, 2003

Related U.S. Application Data

(63) Continuation of application No. PCT/DE01/03040, filed on Aug. 9, 2001.

(30) Foreign Application Priority Data

Oct. 9, 2000 (DE) ..................................... 200 17 392 U

(51) Int. Cl.$^7$ ............................................... C23C 14/14
(52) U.S. Cl. ...................... 427/535; 427/250; 427/264; 427/271
(58) Field of Search ................................. 427/250, 535, 427/264, 271

(56) References Cited

U.S. PATENT DOCUMENTS

| | | | |
|---|---|---|---|
| 4,242,378 A | | 12/1980 | Arai |
| 4,354,911 A | | 10/1982 | Dodd |
| 4,402,998 A | | 9/1983 | Kumagai |
| 4,582,564 A | | 4/1986 | Shanefield |
| 4,622,106 A | * | 11/1986 | Kitagawa ..................... 205/125 |
| 4,685,997 A | | 8/1987 | Beckett |
| 4,774,434 A | * | 9/1988 | Bennion ..................... 313/500 |
| 4,863,808 A | | 9/1989 | Sallo |
| 6,382,677 B1 | | 5/2002 | Kaule et al. |
| 6,726,813 B2 | | 4/2004 | Kaule et al. |

FOREIGN PATENT DOCUMENTS

| | | | |
|---|---|---|---|
| DE | 36 10 379 | 1/1987 | |
| DE | 36 87 250 | 5/1993 | |
| DE | 198 43 823 | 5/1998 | |
| DE | 197 18 177 | 11/1998 | |
| DE | 197 29 891 | 1/1999 | |
| DE | 198 12 932 | 10/1999 | |
| DE | 198 15 175 | 10/1999 | |
| DE | 198 18 968 | 11/1999 | |
| DE | 198 22 075 | 11/1999 | |
| DE | 198 34 348 | 2/2000 | |
| EP | 0 107 983 | 2/1987 | |
| EP | 0 330 733 | 11/1988 | |
| EP | 0 475 145 | 3/1992 | |
| EP | 475145 A | * 3/1992 | ........... B29C/59/14 |
| EP | 0 479 058 | 4/1992 | |
| EP | 0 512 386 | 11/1992 | |
| EP | 0 600 374 | 6/1994 | |
| EP | 0 944 480 B1 | 8/2003 | |
| WO | WO 99/13157 | 3/1999 | |

\* cited by examiner

Primary Examiner—Timothy Meeks
(74) Attorney, Agent, or Firm—Henry M. Feiereisen; Ursula B. Day

(57) ABSTRACT

A partially vapor-deposited metallized film is disclosed including a metallized film that is vapor-deposited across the entire surface, and a metallized film that has been coated a number of times and also a method for producing a partially vapor-deposited metallized film, a metallized film that is vapor-deposited across the entire surface, and a metallized film that has been coated a number of times, wherein either a structure is printed onto a substrate or onto a supporting film with a soluble ink (washable ink) or the base materials are directly cleaned in a vacuum by means of plasma processing and are simultaneously initiated with target atoms, and wherein a metal or the like is vapor-deposited thereon followed by a production of the structured layer, for multiple uses, for example, in securities, as a radio frequency antenna for transponders and the like.

25 Claims, 2 Drawing Sheets

(4) Vapor-Deposition Layer
(3) Initiation Layer
(2) washable ink
(1) Substrate (3) Vapor-Deposition Layer
(2) Initiation Layer
(1) Substrate

US 6,896,938 B2

METALLIZED FILM, METHOD FOR THE PRODUCTION THEREOF, AND USE THEREOF

CROSS-REFERENCES TO RELATED APPLICATIONS

This application is a continuation of prior filed copending PCT International application no. PCT/DE01/03040, filed Aug. 9, 2001.

This application claims the priority of German Patent Application Ser. No. 200 17 392.8, filed Oct. 9, 2000, pursuant to 35 U.S.C. 119(a)–(d), the subject matter of which is incorporated herein by reference.

BACKGROUND OF THE INVENTION

The present invention relates generally to metallized films, and in particular to a metallized film having structured layers, as well as a method for the production of such films and their uses.

Certain metallized films, for example safety films, are known in the prior art. For example, WO 99/13157 discloses safety films for securities and methods for their production. Such a safety film for incorporation or application in or on securities includes a translucent supporting film and a metallic coating applied thereon with metal-free regions that are clearly visible particularly with transmitted light. For the production of these metallized films, the supporting film is prepared, then a printing ink with high pigment content is printed on the supporting film, the printing ink is then dried to form a porous, raised color coating. After formation of a thin metallic masking layer on the thus imprinted supporting film, the color coating and the masking layer which is lying over it or resepctively penetrating into the color coating are removed by washing with a liquid, possibly combined with mechanical action, and finally the supporting film is dried and optionally cut to shape. The metallic masking layer thus remains on the supporting film in those areas originally not covered by the printing ink and may have a thickness of 0.01 $\mu$m to 1 $\mu$m according to the publication.

Furthermore, EP 0 330 733 A1 discloses a safety element in the form of a thread of a translucent plastic film, which has an opaque coating extending across the element and including recesses in the form of characters or patterns to be incorporated and which contains at least in the areas congruent to the recesses coloring and/or luminescent substances, by which the characters and/or patterns are distinguished under suitable light conditions from the safety document and from the opaque coating in contrasting colored form.

In another prior art publication, DE 36 87 250 T2, a method of making metallizing dielectric carriers is disclosed, wherein a layer of metallic chrome is vapor-deposited on a dimensionally stable polyimide substrate under vacuum conditions and afterwards a copper layer is galvanically applied on this chromium layer. In order to produce a desired pattern on the conductive copper tracks, the copper layer is etched and then a layer of gold or tin or a solder is applied on these conductive tracks.

DE 36 10 379 A1 discloses a method of making a film provided on at least one of its surfaces with a metal layer interrupted at preselected spots. In this method, the metal layer is applied in the preselected spots onto a poorly sticking substrate and mechanically cleared away from the preselected spots. In this way, the poorly sticking substrate can be so distributed across the entire surface of the film that the desired pattern is realized. Regardless of this pattern, the entire surface is then metallized, so that the metallization can be accomplished relatively inexpensively. Since the layer of metal is only loosely applied on the poorly sticking surface, it can be removed from the surface relatively easily by mechanical means.

Other metallized films and methods for their production are known, for example, from EP 0.107,983 A1, EP 0.479, 058 A1, EP 0.600.374 A1, DE 198 34 348 A1, DE 198 15 175 A1, DE 198 12 932 A1, DE 196 43 823 A1, DE 197 18 177 A1, DE 197 29 891 A1, DE 198 22 075 A1, DE 198 18 968 A1, U.S. Pat. No. 4,242,378, U.S. Pat. No. 4,685,997 and U.S. Pat. No. 4,863,808. To avoid mere repetitions of the respective contents, their full disclosure is incorporated herein by reference, in particular with respect to the structures, layer thicknesses and materials of the metallized films as well as the process steps for the production of patterns with the metallic layer.

While for particular applications, such as, e.g., safety films for securities, some applications of metallized films in principle desire to keep the metallic layer as thin as possible, so that it is spread as little as possible, other applications require thicker and nevertheless cleanly structured or formed metallic layers with fine pattern, which cannot be made in a satisfactory way by conventional methods, such as, e.g,. for conductive tracks or printed boards, particularly for antennas, as found, e.g. in cell phones.

It would therefore be desirable and advantageous to provide safety films for securities with improved metallized films to obviate prior art shortcomings and to create a metallized film and a method for its production.

SUMMARY OF THE INVENTION

The present invention resolves prior art problems by providing a metallized film comprising a substrate or a supporting film, having one or more structured layer(s), which can be different from each other in one level, and, optionally, a superimposed thicker metallic reinforcement layer.

One aspect of the present invention is a film having structured layers of a variety of diverse metals, metal compositions, alloys or insulators on one or both sides of a carrier material. Furthermore, these structured layers should be accurately producible, in order to be able to build, for example, conductive tracks or the like, such that a film metallized across the entire surface, includes a substrate or a supporting film, an initiation layer of target atoms, a structured layer of a metal, a metal composition, an alloy or an insulator and a negatively imprinted galvanic resist.

According to another aspect of the present invention, such a metallized film includes in accordance with one embodiment of the present invention a substrate or a supporting film, on which one or more structured thin metallic film(s) is/are applied, generally vapor-deposited, whereby the substrate or the supporting film is pretreated before the metallization by cleaning and initiation.

If necessary, a thicker metallic reinforcement layer can be provided on the thin metallic layer, whereby the reinforcement layer is preferably made in accordance with the present invention by chemical or galvanic material application in order to attain a reinforcement of the pattern layer with material. This is necessary when the object is to obtain layers of more than 1 $\mu$m, since these layer thicknesses can be vacuum-deposited only in a very complex manner. However, the reinforcement layer exhibits the same pattern as the pattern layer, wherein a slight extension of the reinforcement layer beyond the pattern layer is also within the scope of the invention.

According to another aspect of the invention, the method of making a partially vapor-deposited metallized film includes the steps of imprinting a structure on a substrate or a supporting film with a soluble ink (washable ink), cleaning the film in a vacuum by means of plasma treatment and simultaneously initiating the film with target atoms; applying one of a vapor-deposit on the thus-pretreated film with one or more of a material selected from the group consisting of metal, a metal composition, an alloy, or applying an insulator through printing or lacquering; and thereafter removing one of the superimposed metal, metal composition, alloy or insulator so that the metal, the metal composition, alloy or insulator including initiation remains in the areas of the substrate or the film that were not printed previously with soluble ink to produce a structured layer.

According to the method of invention for the production of the metallized film, the substrate is cleaned and initiated. This process step is a prerequisite for good adhesion of the partially structured or fully applied layer to the substrate. Also, in the case of a multilayer vapor-deposition, this step is prerequisite for ensuring good adhesion of the layers with one another. Here, this process step forms the basis for the production of finely structured layers.

Before the actual functional layer is applied, an ink, either with or without pigmentation and soluble in any desired solvent, e.g. water, alcohols, ketones, esters, is applied through gravure printing, flexographic printing, screen printing, digital printing or similar printing methods, and subsequently a layer of the material to be structured is applied at a thickness of 0.001 µm up to 50 µm by vapor-deposition, sputtering, printing, lacquering, spraying and similar methods. In water-soluble systems, starch, casein, PVA or other water-soluble binding agents or mixtures thereof, can be used. If pigments are used, $TiO_x$, $SiO_x$, ZnS, $Al_xO_y$ or similar substances or mixtures thereof with different grain size distributions can, for example, be added. The solubility of the respectively printed structure is important for this process. In general, water-soluble inks are used, however inks suited to all conceivable solvents can be used as well. Pigments can be added to the inks, thereby greatly improving the washibility in the dissolving and mechanical washing process. In order to further improve etching of the masked color coat, a thin pigmented color coat of approx. 0.01 µm to a 0.5 µm thickness, a pure pigment layer, or pigments in suspension, can be applied across the entire surface or at precise spots. The used pigments involve in general ZnS, $TiO_2$, however all other known pigments can be used.

As already stated above, the pretreatment of the substrate by the cleaning and initiation step is a condition for good adhesion. In order to achieve this, in particular, to improve the adhesion of the material, the imprinted substrate can be pretreated by means of an INLINE plasma or corona process. This pretreatment liberates the film surface from toner residues of the printing inks and is activated at the same time, since terminal polar groups are produced. Furthermore, a thin metal or metal oxide layer can be applied as an adhesion mediator through sputtering or evaporation under vacuum at the same time as the plasma pretreatment. For this, in particular Cr, Al, Ag, Ni, Cu, Ti, $TiO_2$, $SiO_x$, $CrO_x$, are suitable.

The metallic layers can be applied in the context of the method according to the invention only partially or across the entire surface on the substrate or the supporting film.

In accordance with a variation of the method according to the present invention, a partial metallic layer is produced by first printing a soluble ink or lacquer on a substrate, followed by the cleaning and initiation step, and subsequently applying, for example, a Cu layer for the formation of the pattern layer on the supporting film. Then, a mechanical washing process removes the ink in order to realize the desired structure. After that, if necessary, this pattern layer is galvanically reinforced for formation of the reinforcement layer.

According to another method variation of the present invention, a metallization across the entire surface is applied on the supporting film after the cleaning and initiation step, for example, with Cu, in particular, with a layer thickness of up to approximately 1.5 µm. Subsequently, the ultimately desired pattern is realized by imprinting a galvanic resist, followed, optionally, by a galvanic reinforcement.

A further metallized film according to the invention includes a substrate or a supporting film, a metallic pattern layer applied thereon, made through etching. The respective method involves application of an etch resist in correspondence with the desired pattern across the entire surface of the metallic layer, which contains for example Cu, and afterwards an etching method is carried out, so that the pattern layer remains in the desired shape and thickness to thereby make the metallic layer structures.

In addition, the method according to present invention permits the preparation of a metallized film with a multilayer structure (multilayer). The multilayer structure can be realized by layers of different materials placed across the entire surface above one another. The multilayer products are applicable in a wide range through combination of layers of different physical characteristics, e.g. different conductivity, magnetizability, absorption behavior, shielding, barrier, further optical effects in a product.

On the other hand, functional multilayer systems can be developed through repeated application of the method for layer structuring as well as precise printing in the length and side registers for the preceding structuring, in particular partial or full deposition of lacquer and film layers between the individual layers. In principle, any number of layers can be realized by the method according to invention. Depending upon further use, the product can be equipped with a sealable adhesive (hot or cold seal adhesives) and like a hot embossing film can be applied on different carrier substrates. After the application, the supporting film can be either removed or remains on the product. In the latter case, the backside of the supporting film may be provided with an additional feature such as scratchproof or antistatic properties. The multilayer systems can be refined by further process steps, for example, by a further lamination, which is particularly useful.

Also, in the production of the metallized film with a multilayer structure, an important condition for the improvement of the adhesion of the vapor-deposited layers of metal with one another is the step of the plasma pretreatment under simultaneous sputter initiation with the same metal in each vapor-deposition step of the multilayer vaporization of same material. The multilayer vapor-deposition with different materials involves pretreatment of the already existing layer in analogous fashion.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
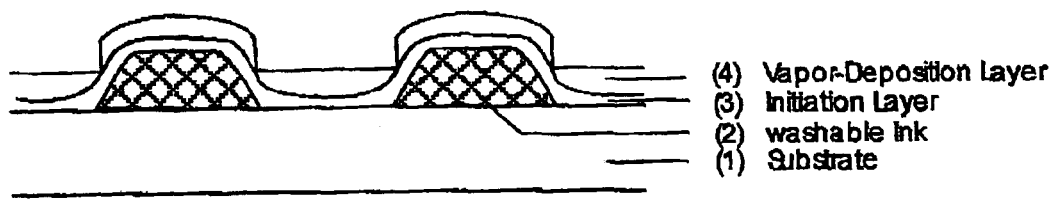
FIG. 1 is a schematic illustration of a section of a layer structure of a partially vapor-deposited metallic film in the production stage according to the present invention.

Throughout all the Figures, same or corresponding elements are generally indicated by same reference numerals.

Turning now to the drawing, and in particular to FIG. 1, there is shown a partially vapor-deposited metallic film in production, wherein as part of the production a substrate or a supporting film 1 is provided. A soluble ink (washable ink) 2 is applied on this substrate. This imprinted substrate or this imprinted film is pretreated by a cleaning and initiation process to thereby generate an initiation layer 3 for better adhesion of the metallic layer, then the metallic layer 4 is vapor-deposited.

Figure 2:
FIG. 2 is a schematic illustration of a section of the finished final product of a partially vapor-deposited metallic film.

FIG. 2 shows the partially vapor-deposited metallic film as a final product, in which the soluble ink (washable ink) was removed by a mechanical washing process and shows that after dissolution of the soluble ink (washable ink) the vapor-deposited metallic layer 3 including initiation 2 was partially formed on the substrate 1.

Figure 3:
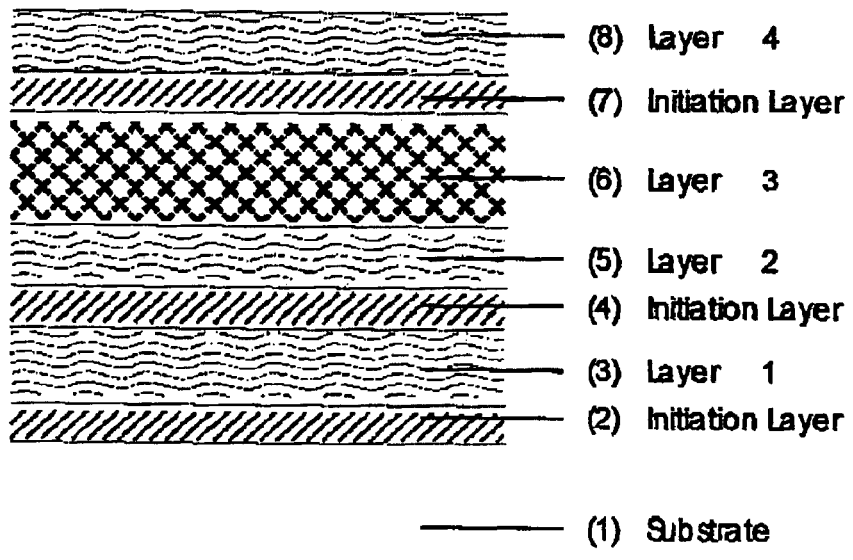
FIG. 3 is a schematic illustration of a section of the finished final product of a multilayer structure across the entire surface.

As shown in FIG. 3, the production of a metallic film with a multilayer structure involves the use of a substrate 1 which is provided with an initiation layer 2 produced by the afore-described plasma purification process with simultaneous initiation. The metal layer 3 is then vapor-deposited on this initiation layer 2. The steps of initiation and metal vaporization are repeated as often as necessary for the desired final product. All initiation layers can hereby be made of same material or from different materials, and the metal layers can respectively be made also from same materials or different materials. In addition, one or more layers of this structure can also include non-metallic substances, as mentioned above. In the example shown here four initiation and vapor-deposition steps were executed.

Depending on the application, this full surface structure from FIG. 3 can already correspond to the final product, as it is used, e.g. for optical coatings of reflection layers, whereby the layer structure and the number of layers allows adjustment of the wavelength ranges for reflection or, it can be structured through application of an etch resist and etching. The final product would then correspond to the one as shown in FIG. 2, however with several superimposed initiation and vapor-deposition layers.

Figure 4:
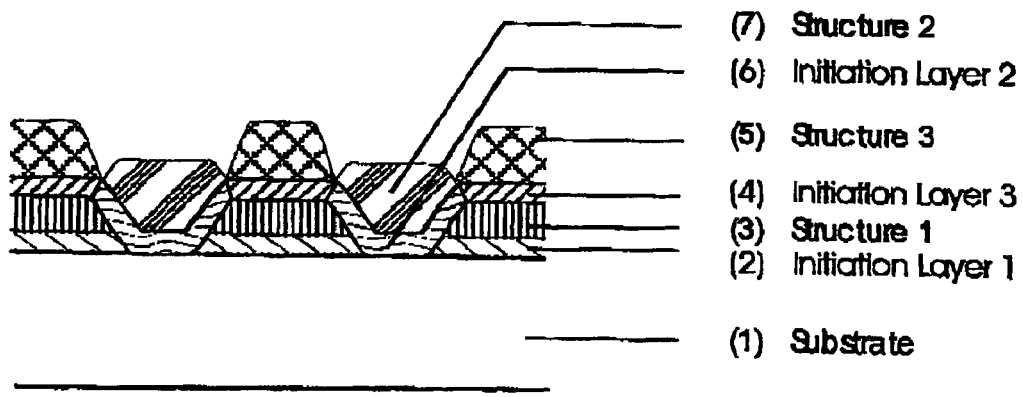
FIG. 4 is a schematic illustration of a section of the finished end product of a partially vapor-deposited multilayer structure.

FIG. 4 shows another embodiment of the multilayer structure, in which a substrate 1 is initiated and structure 1 represented by 3 is produced, as already described in FIG. 2. After structuring layer 3 to the structure 1, soluble ink (washable ink) is imprinted at precise spots upon the blank of the first method cycle, afterwards it is again initiated 6 (initiation 2) and coated 7, and the layer is structured 7 to structure 2. Subsequently, the structure 1 is again provided with a soluble ink, initiated 4 and structured 5, thereby producing the structure 3. This process can be repeated several times, in principle as often as desired. Thus, it is possible to precisely make two structures of different materials in the same level, where the structure 2 represented as 6 is exactly situated in the regions which were removed during the production of structure 1 represented by 3.

The metallized films are used for RF (radio frequency) antennas, in particular transponders, made thereof. They are suitable in particular as smart cards, used as contactless systems, e.g. for access authorizations in public transportation, in skiing areas as ski passes or for safety locks; in addition, they are useable for credit cards or customer cards as well as in air traffic, for example, Miles & More cards. Furthermore, they can be used as smart labels in contactless readable and recordable alternative to the bar code, for example, for postal services, libraries and in retail. The application as tags, utilized in airports as suitcase tags, is also possible. As RF antennas, they can also be used as theft labels, whereby an RF antenna is combined with a capacitor (printed or inserted), so that a signal is triggered when leaving a store, if the system has not been deactivated.

Moreover, the use as a control label for quality control is conceivable, whereby the RF antenna is likewise combined with a capacitor (printed or inserted). Thus, an acoustic signal can be queried during final inspection, for example, by vehicles through different frequencies, to determined whether "non-visible" components were installed in the vehicle, whereby the labels react on the respective components only to a certain frequency.

The metallized films can also be used as flat antennas to save space and weight for cell phones, whereby they are then integrated in the cell phone casing. This affords the particular advantage that an effective shielding of the antenna on the body-confronting side is possible to thereby decrease exposure to radiation. In addition, a faster data communication in the WAP technology can be achieved.

The metallized films can also be used in planar antennas as alternative to the parabolic reflector in the entertainment electronics, or as an alternative receiver unit in science.

A further use option of the films according to the invention involves the use in the area of printed circuit boards as an adhesiveless base material. Hereby, there is the advantage that, for example, between a Cu layer and a PI film there is no interfering adhesive layer present which typically is utilized for base materials used for the printed circuit board production between the Cu layer and the PI film as an adhesive layer of approx. 10 $\mu$m to 15 $\mu$m thickness, and interferes with further processing to thereby render the production of delicate printed circuit boards almost impossible.

Furthermore, the metallized films can be used in printed circuit boards that only have to carry signal streams and can be manufactured in a cost-effective manner with the manufacturing process according to the invention, about 90% cheaper than with the conventional processes. These are particular printed circuit boards from which sensor elements for different applications, such as for example remote controls, can be built. The sensor elements can then operate according to the physical principles capacitively, inductively, conductively, through heat or pressure.

A particularly interesting field of use of the metallized films according to the invention involves the field of shielding for EMC-prone areas and building groups. In particular when higher frequencies are involved, exceptional screen absorptions are achieved with metallized films. The metallized vapor-deposited plastic films enable production of effective and very inexpensive electrical shieldings which are suitable to reduce or eliminate the EMC problem. They can find application in particular in motor casings, cell phone shells, printed circuit boards and sensors.

In addition, metallized films are usable as threads, strips or patches for bank notes, securities and credit cards.

In a preferred embodiment of the invention, the production of the pattern layer involves initially the making of a pattern-demarcating print format through gravure printing. The INLINE plasma process is preferably used before the metallization, to avoid the changing of the ink, when using soluble inks (washable inks), because the ink binding agent runs more broadly than the actual print, and additionally the binding agent can be carried over by the doctor blade into zones which should not be imprinted. With high-energy, e.g. argon or argon/oxygen plasma, a shade is removed before the metallization, in other words: a plasma cleaning of the imprinted supporting film is carried out. As further advantage the plasma additionally activates the film surface of the supporting film and creates polar terminal groups on this surface, resulting in an additional enhancement of the metal adhesion. Still another advantage relates to the plasma pretreatment which involves also an initiation of the film surface of the supporting film with target atoms, such as for example Ti, Cu, Al or Cr, which likewise improves the adhesion of the metal upon the non-printed areas of the film surface of the supporting film.

The supporting film preferably involves a flexible plastic film, selected from the group consisting of PI (polyimide), PPS (polyphenylene sulfide), PEEK polyetheretherketone), PEK (polyetherketone), PK (polyketone), PEI polyetherimide), PSU (polysulfone), PESU (polyethersulfone), PAEK (polyaryletherketone), LCP (liquid crystal polymer), TPU=PUR (polyurethane), PEN (polyethylene napthalate), PBT (polybutylene terephthalate), PET (polyethylene terephthalate) (OPET, PETG, APET), PA (polyamide) (PA 6, PA 6,6, PA 4,6, PA 6/66, PA 12, PA 6.12), PC (polycarbonate), COC, POM (polyoxymethylene), ABS (acrylonitril butadiene styrene), PVC (polyvinylchloride), PP (polyphenylene). PE (polyethylene), ETFE (ethylene/tetrafluoroethylene), PTFE (polytetraflouroethylene), at a thickness of 6 $\mu$m to 700 $\mu$m. The carrier substance involves paper with a thickness of 30 g/m$^2$ to 200 g/m$^2$ or aluminum foils with a thickness of 8 $\mu$m to 100 $\mu$m as well as spunbonded materials, non-woven staple fibers and SMS fleece, made of the following polymers PP, PET, PA and PPS, as well as viscose fleece, which all have a thickness of 20 g/m$^2$ to 500 g/m$^2$. The materials set forth above are in particular suitable for a full surface vapor-deposition.

Moreover, the afore-mentioned films can be additionally structured (3D). This structuring can be implemented through brushing, scraping and/or thermal embossing into the films as well as through embossing into a lacquer which has not yet hardened and was deposited upon the film by means of thermal, ionic, or UV hardening (radical or cationic).

For the production of the multilayer systems, the individual carrier materials can be developed from different layers, like different polymer films, as mentioned above, as well as from the combination film/paper or films/non-wovens and like combinations. Likewise a layer already vapor-deposited or a metal film can be in the carrier material.

For the partial metallic vaporization, polymers are particularly suitable as supporting films and are selected from the group consisting of PI, PPS; PEEK, PEK, PK, PEI, PSU, PESU, PAEK, LCP, TPU, PEN, PBT, PET (OPET, PETG, APET), PA (PA 6, PA 6,6, PA 4,6, PA 6/66, PA 12, PA 6.12), PC, COC, POM, ABS, PVC, PP, PE, ETFE, PTFE, at a thickness of 6 $\mu$m to 700 $\mu$m. Also in this case, the production of the multilayer systems may include the production of the individual carrier materials from different layers, like different polymer films, as mentioned above, as well as from the combination film/paper or films/non-wovens and like combinations. Likewise, a layer already vapor-deposited or a metal film may be provided in the carrier material. The partially vapor-deposited layer is hereby preferably disposed on the smooth polymer side.

The pattern layer and, if necessary, the reinforcement layer preferably form patterns, such as e.g. tracks of metal, which are made at least essentially of Cu according to a variation of the invention.

The supporting film has a thickness of 6 $\mu$m to 700 $\mu$m, preferably of 12 $\mu$m to 100 $\mu$m, especially preferred of 15 $\mu$m to 50 $\mu$m.

When a pattern layer is later provided with a reinforcement layer, the pattern layer has preferably a thickness of at least about 0.05 $\mu$m to 1 $\mu$m, preferably 0.2 $\mu$m, in particular 0.4 $\mu$m.

The pattern layer, optionally together with the reinforcement layer, has/have preferably, optionally together, a thickness of 1 $\mu$m up to about 50 $\mu$m, preferably about 2 $\mu$m to 35 $\mu$m, in particular 3 $\mu$m to 15 $\mu$m.

Preferred thicknesses of the pure reinforcement layer in dependence on the respective manufacturing process are at the partial metallization of the supporting film and post-reinforcement through chemical or galvanic processes about 1 $\mu$m to 25 $\mu$m, in particular 1 $\mu$m to 5 $\mu$m and especially 2 $\mu$m to 3 $\mu$m, and at full surface base coating with metallic material (in particular approx. 0.2 $\mu$m to 0.4 $\mu$m layer thickness) with post-reinforcement and differential etching approx. 2 $\mu$m to 25 $\mu$m, whereby an etch resist at a thickness of e.g. about 2 $\mu$m to 3 $\mu$m is utilized.

In accordance with respectively preferred configurations of the invention, the pattern layer, optionally together with the reinforcement layer, has a structure which contains zones liberated from metallization and having a width of less than approx. 150 $\mu$m. This means that, e.g., the pattern layer, optionally together with the reinforcement layer, when forming conductive tracks, these conductive tracks have a distance of less than approx. 150 $\mu$m.

The structured layer(s) is/are made of metals, preferably of Cu, Al, Fe, Ag, Au, Ni, Cr, metal compositions, preferably TiO$_2$, CrO$_x$, ZnS, ITO, FTO, ATO, ZnO, Al$_2$O$_3$, SiO$_x$, alloys, preferably Cu—Al, Cu—Zn as well as insulators, like organic substances and their combinations (color and lacquer systems), e.g. systems of epoxy, polyester, colophonium, acrylate, alkyde, melamine, PVA, PVC, isocyanate, urethane, which systems can be both UV or thermal hardening.

The preferred method is carried out as follows (individually or combined):

cleaning and initiation of the supporting film or carrier substance by plasma pretreatment in vacuum, partial metallization, for example with Cu, of a supporting film or a carrier substance, preferably made of plastic, whereby a soluble ink (washable ink) is is deposited before initiation, metallization, for example with Cu, across an entire surface of a supporting film or a carrier substance, refinement, e.g. of a film metallized with Cu, by imprinting with an etch resist, insulation, or a silver conductive paste, gravure or flexographic printing of a silver conductive paste on a plastic film, gravure or flexographic printing of a conductive base lacquer for electroplating, gravure or flexographic printing of a caustic or galvanic resist upon a plastic film in particular preferably metallized with Cu, gravure or flexographic printing of a primer as bonding agent for metallization on defined zones of the film (structuring by zones that have better adhesion), an insulation application, a silver application and/or a lamination on the backside are conceivable and in some instances desirable.

Thus, metallic layers or layer combinations can be produced, for example from Cu, with a thickness of clearly over 0.2 μm and pitch distances below 0.5 μm.

Compared to conventional proposals, the individual variations and configurations of the metallized films according to the invention and their production methods have substantial advantages which include the reduction of production costs by 20% and even by up to 50%, the use of existing technical devices and known systems, ecological advantages, and the production capability on large scale.

In the following examples, the present invention is described in more detail with reference to specific application.

EXAMPLE 1

For electronic components, such as e.g. RF antennas, flat antennas in the cell phone, or even printed circuit boards, higher conductivities are necessary in dependence on the application.

For such components, structures with thicker Cu layers are necessary which are obtained by vapor-depositing 0.5 μm Cu upon a PET film of a thickness of 50 μm across the entire surface thereof, and subsequently providing the PET film "negatively" with a galvanic resist of 2 μm to 5 μm thickness through gravure printing. Thereafter, the non-printed Cu surface is reinforced galvanically with Cu. In further steps, the galvanic resist is stripped away and the desired component/pattern is finished through differential etching.

EXAMPLE 2

For applications that require less conductivites, e.g. printed circuit boards, which transfer signal streams, or antennas which operate in the range of high frequency of above 500 MHz, the use of partly thinner Cu layers is sufficient. These can be produced very cost-efficinetly by a partially Cu-metallized film. The Cu thickness is preferably 0.1 μm to 0.5 μm Cu and the used PET film is preferably 36 μm to 100 μm thick.

For the production of a partially vapor-deposited film, which should have a small conductivity, a 50 μm thick PET film is used, on which a structure is imprinted with soluble ink. The thus imprinted film is vapor-deposited with Cu at a thickness of approx. 0.1 μm to 0.5 μm under simultaneous initiation. Subsequently, the solubly ink including the superimposed Cu is removed. Cu including initiation remains on the film in the areas that are not printed with soluble ink.

EXAMPLE 3

When the supporting film or carrier substances are repeatedly vapor-deposited across the entire surface, the combination of types and number of layers allows certain wavelengths of light to pass through or to be blocked. For example, when an ETFE film is repeatedly vapor-deposited across the entire surface, the distinct selection of radiation, e.g. reflection of visible radiation or radiant heat, is possible.

For the production of such a multilayer system, a 200 μm thick ETFE film is used as substrate. On this film, a 0.1 μm to 0.2 μm thick Al layer is vapor-deposited as metal layer under simultaneous initiation. Then, an oxide layer can be sputtered under simultaneous initiation, consisting of a 0.01 μm to 0.2 μm thick ITO. These two steps can be repeated several times.

EXAMPLE 4

Structured multilayer systems which require Cu thicknesses between 0.5 μm and 3.0 μm, whereby the thickness is preferably closer to 1.0 μm, are used in areas which require smaller Cu thicknesses than in Example 1, e.g. printed circuit boards used for signal streams, antennas for high frequency transmission, heating elements and such things.

For the production of a structured multilayer system, that exhibits the same structure in all levels, a 50 μm thick PET film is used as supporting film, on which initially a metal layer of 0.2 μm Cu is vapor-deposited under simultaneous initiation. This process is then repeated, for example, four times. Applied thereon is an etch resist, subsequently etched, and the etch resist is stripped away.

Compared to the metallized film described in Example 2, more exact structures can be obtained by the manufacturing process described above, which depends considerably on the application of the etch resist. Thus, it is possible to manufacture finely-structured printed circuit boards.

EXAMPLE 5

With structured multilayer systems, which have layers that possess different materials in one level, it is possible, for example, to produce different conductivities or optical effects in one level which mean a further (higher) safety stage when security features are involved. A further use possibility relates to the identification antennas (quality control in the automotive manufacture) or RF antennas that serve the source safety. Hereby, the antenna can be adjusted capacitively by "targeted filling with a dielectric material" between the conductive tracks of the antenna so that the need for adding a capacitor or a more complex parallel layer is eliminated.

A structured multilayer system with different materials in one level includes a 100 μm thick PET film, on which is printed a soluble ink under the positive printing. Subsequently, 0.2 μm thick Cu as metal layer is vapor-deposited under simultaneous initiation and then washed. On this layer, soluble ink (washable ink) is applied under negative printing. Sputtered therein is an oxide layer of $SiO_x$ under simultaneous initiation at a thickness of 0.2 μm, and afterwards the soluble ink (washable ink) is removed by washing from the areas that are not occupied by metal.

EXAMPLE 6

For applications which require smaller conductivities, such as e.g. printed circuit boards which transfer signal streams, or antennas which operate in the range of high frequency of above 500 MHz, thinner Cu layers are sometimes sufficient.

For this application, a PET film is used that is preferably 50 μm thick and on which a vapor-deposited metallic layer without pretreatment would not stick. In a first process step, a well-adhering metallization primer is applied at a thickness of approx. 1 µm to 5 µm (structure under positive printing). The thus-imprinted film is vapor-deposited with Cu at a thickness of 0.1 µm to 3 µm once or repeatedly under simultaneous initiation. Subsequently, the Cu is removed mechanically from the areas of the film not imprinted by the primer.

The scope of the invention includes further measures to improve the anchoring of the metallization (pattern layer) upon the substrate as well as optionally the adhesion of its metallic layers (pattern layer and reinforcement layer) with one another. Suitable are hereby in particular Cr, Al, Ag, Ti, Ni, Cu, $TiO_x$, $SiO_x$, $CrO_x$.

Higher rates of vapor-deposition and/or galvanic reinforcements enable a further increase of attainable thicknesses of the metallic layer(s), such as, for example, conductive tracks. Advantageous are also improvements of the partial distance of the layer, as far as this is necessary, and the entire production environment, e.g. clean-room production. If need be, production aids, like the various resists and lacquers, primer, soluble ink (washable ink), conductive paint can also be optimized. Application of the metallization of the pattern layer can be implemented, for example, by means of well-known vapor-deposition techniques, including normal vapor-deposition techniques and multilayer vapor-deposition. For the anchoring technology of the metallization of the supporting film, plasma recipes can be optimized in particular regarding the initiation and activation. Demetallization permits variations, i.a. for the selection of the soluble ink (washable ink), the high pressure unit, washing drum, stripper unit, etc. When using gravure printing, the gravure cylinder, spreading unit and the soluble ink (washable ink) can be conformed. Etch resist and etching bath, if required, can be selected suitably. Conductive paints can have conductive pigments or polymers. Respective measures in combination with the afore-described concrete features are part of the present invention, even if they should be already known from the prior art.

Any variations, modifications and substitutions of the preferred configurations and variations within the scope of the artisan are included by the disclosure of the present specification. While the invention has been illustrated and described as embodied in a metallized film, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and their equivalents:

1. A method of making a partially vapor-deposited metallized film, comprising the steps of:
    imprinting a structure on a flexible substrate with a soluble ink,
    thereafter pre-treating the film by cleaning the film surface in a vacuum by means of a plasma treatment and simultaneously initiating the film with target atoms forming an initial layer;
    vapor-depositing one or more of a material selected from the group consisting of metal, a metal composition and an alloy on the pretreated film, or applying an insulator by a method selected from the group consisting of printing or lacquering; and thereafter
    removing one of the superimposed metal, metal composition, alloy or insulator so that the metal, the metal composition, alloy or insulator including an initiation layer remains in the areas of the substrate that insulator so that the metal, the metal composition, alloy or insulator including an initiation layer remains in the areas of the substrate that were not printed previously with soluble ink, so as to produce a structured layer, wherein the steps of plasma treatment in vacuum under simultaneous initiation with target atoms and the metal vapor-deposition are repeated 2 or more times to form a multilayered film.

2. The method of claim 1, further comprising the step of applying one of a chemical or physical galvanic material for forming a reinforcement layer for the structured layer.

3. The method of claim 2, wherein the structured layer together with the reinforcement layer has a thickness from 1 µm to 50 µm.

4. The method of claim 3, wherein the range is from 2 µm to 35 µm.

5. The method of claim 4, wherein the range is from 3 µm to 15 µm.

6. The method of making a metallized film of claim 1, wherein an insulator is applied.

7. The method of claim 6, wherein the materials for formation of the structured layer are identical or different.

8. The method of claim 1, wherein the target atoms for the development of the individual initiation layers are from one of identical or different materials.

9. The method of claim 1, wherein the materials for formation of the structured layer are identical or different.

10. The method of claim 1, wherein the structured layer comprises structures made of different materials in a same level of the structured layer.

11. The method of claim 1, wherein the metals are selected from the group consisting of Cu, Al, Fe, Ag, Cr, Ni and Zn, and wherein the metal compositions are selected from the group consisting of $TiO_2$, $CrO_x$, ZnS, ITO, FTO, ATO, ZnO, $Al_2O_3$ and $SiO_x$, and wherein the alloys are selected from the group consisting of Cu—Al and Cu—Zn, and wherein the insulators are organic substances.

12. The method of claim 1, wherein one of the vapor-deposited metallic layer or the insulation layer has a thickness of 0.01 µm to 3.0 µm.

13. The method of claim 12, wherein the range is from 0.1 µm to 1.0 µm.

14. The method of claim 13, wherein the range is from 0.2 µm to 0.4 µm.

15. The method of claim 1, wherein the target atoms are selected from the group consisting of Cr, Al, Ag, Ti, Cu, Ni, $SiO_x$, $CrO_x$, $TiO_x$.

16. The method of claim 1, wherein the target atoms are applied at a thickness of 0.2 nm to 50 nm.

17. The method of claim 1, wherein the substrate is selected from the group consisting of PI, PPS, PEEK, PEK, PK, PEI, PSU, PESU, PAEK, LCP, TPU, PEN, PBT, PET (OPET, PETG, APET), PA (PA 6, PA 6,6, PA 4,6, PA 6/66, PA 12, PA 6.12), PC, COC, POM, ABS, PVC, PP, PE, PTFE, ETFE, at a thickness of 6 µm to 700 µm.

18. The method of claim 1, wherein the fexible substrate has a thickness of 6 µm to 700 µm.

19. The method of claim 18, wherein the range is from 12 µm to 100 µm.

20. The method of claim 19, wherein the range is from 15 μm to 50 μm.

21. The method of claim 1, wherein the substrate is selected from the group consisting of paper, aluminum foil, non-woven staple fiber, and SMS, which were made of the following polymers PP, PET, PA and PPS as well as viscose fleece, which all have a thickness of 20 g/m² to 500 g/m².

22. The method of claim 1, wherein the film is metallized across an entire surface of the substrate, an initiation layer of target atoms, a structured layer of a metal, a metal composition, an alloy or an insulator.

23. The method of claim 1, wherein the substrate is a supporting film having one or more structured layers, wherein each structured layer includes structures made of different materials in the same structured layer and, optionally, is provided with a superimposed copper built-up reinforcement layer.

24. A method for applying a metallized film produced according to claim 1, comprising the step of using the film as RF antennas for transponders, for smart cards, smart label, tags, as RF antennas in theft labels, as control labels for quality control, as flat antennas for cell phones, as planar antennas for high-frequency technology, as printed circuit boards, as device for shielding in the EMC range.

25. A method of making a partially vapor-deposited metallized film, comprising the steps of:

imprinting a structure on a flexible substrate with a soluble ink, thereafter pre-treating the film by cleaning the film surface in a vacuum by means of a plasma treatment and simultaneously initiating the film with target atoms forming an initial layer;

applying an insulator on the pretreated film by one of lacquering or printing; thereafter removing the insulator including an initiation layer that remains in the areas of the substrate that were not printed previously with soluble ink, so as to produce a structured layer, wherein the steps of plasma treatment in vacuum under simultaneous initiation with target atoms and the metal vapor-deposition are repeated two or more times to form a multilayered film.

* * * * *